US011133780B2

(12) United States Patent
Huang

(10) Patent No.: US 11,133,780 B2

(45) Date of Patent: Sep. 28, 2021

(54) NON-BREAK POWER TRANSFER FOR VARIABLE FREQUENCY GENERATORS

(71) Applicant: THE BOEING COMPANY, Chicago, IL (US)

(72) Inventor: Jian Huang, Everett, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/432,040

(22) Filed: Jun. 5, 2019

(65) Prior Publication Data

US 2020/0389127 A1 Dec. 10, 2020

(51) Int. Cl.

| | |
|---|---|
| ***H02J 3/00*** | (2006.01) |
| ***B64D 41/00*** | (2006.01) |
| ***H02P 9/10*** | (2006.01) |
| ***H03B 23/00*** | (2006.01) |
| ***B64D 27/26*** | (2006.01) |
| *H02P 101/30* | (2015.01) |

(52) U.S. Cl.

CPC ............ *H03B 23/00* (2013.01); *B64D 27/26* (2013.01); *H02P 2101/30* (2015.01)

(58) Field of Classification Search

None

See application file for complete search history.

(56) References Cited

U.S. PATENT DOCUMENTS 5,550,455 A * 8/1996 Baker .................... H02J 9/066 322/23
5,844,329 A * 12/1998 Bailey .................... H02J 9/061 307/66
6,700,222 B2 * 3/2004 Turvey .................... H02J 3/005 307/84
7,692,335 B2 * 4/2010 Michalko ............... H02K 7/003 307/84
7,772,953 B2 8/2010 Huang et al.
7,772,954 B2 8/2010 Huang et al.
8,089,179 B2 * 1/2012 Legros ...................... H02P 9/48 307/84
8,760,004 B2 * 6/2014 Weale ............... H02J 13/00028 307/11
8,928,179 B2 * 1/2015 Said .......................... H02J 3/34 307/87
10,443,504 B2 * 10/2019 Dalal ...................... F02C 7/262
10,493,930 B2 * 12/2019 Shander .................... H02J 4/00
10,530,153 B2 * 1/2020 Huang ................. H02J 3/0073

OTHER PUBLICATIONS

McLyman, William T., "Transformer and Inductor Design Handbook", Third Edition, Revised and Expanded, 2004, Marcel Dekker, Inc., 533 pgs.

* cited by examiner

*Primary Examiner* — Kenneth B Wells

(57) ABSTRACT

An aircraft includes an engine and a first variable frequency generator having a first rotor that is rotatable at a rate that is based on a rotational rate of the engine to cause the first variable frequency generator to generate a first multiphase signal. The aircraft further includes a second variable frequency generator having a second rotor that is rotatable at the rate to cause the second variable frequency generator to generate a second multiphase signal. The first multiphase signal is phase aligned with the second multiphase signal. The aircraft further includes one or more switches coupled to a first electrical system and configured to selectively provide power to the first electrical system based on either the first multiphase signal or the second multiphase signal.

20 Claims, 8 Drawing Sheets

NON-BREAK POWER TRANSFER FOR VARIABLE FREQUENCY GENERATORS

FIELD

The present disclosure is generally related to electrical devices and more specifically to variable frequency generators.

BACKGROUND

Aircraft and other vehicles include electrical components that provide electrical energy (i.e., power) to various vehicle systems and devices. For example, an aircraft can include an engine, a generator that provides alternating current (AC) power based on rotation of the engine, and cables (e.g., "feeders") that provide the AC power to certain components of the aircraft.

In some cases, an aircraft is configured to transfer powering of certain components from one power source to another power source. For example, an aircraft can be configured to transfer powering of components during a flight from one generator of the aircraft to another generator of the aircraft. As another example, the aircraft can be configured to transfer powering of components from a generator of the aircraft to an external ground-based power source upon landing at an airport.

In some designs, frequency of AC power provided by a generator is variable. For example, speed of an engine may vary and may change frequency of electrical signals provided by the generator. In this case, power transfer between the generator and another power source (e.g., another generator or a ground-based power source) can introduce an abrupt change in voltage, current, or frequency of electrical signals provided to components. Certain aircraft include circuitry configured to "smooth" or eliminate the change in voltage, current, or frequency of the electrical signals. The circuitry can add weight to the aircraft (increasing fuel consumption) and cost associated with design and assembly of the aircraft.

SUMMARY

In a particular implementation, an aircraft includes an engine and a first variable frequency generator having a first rotor and a first stator. The first rotor is coupled, via a first rotary coupling, to the engine and is rotatable at a rate that is based on a rotational rate of the engine to cause the first variable frequency generator to generate a first multiphase signal. The aircraft further includes a second variable frequency generator having a second rotor and a second stator. The second rotor is coupled, via a second rotary coupling, to the engine and is rotatable at the rate that is based on the rotational rate of the engine to cause the second variable frequency generator to generate a second multiphase signal. The first rotary coupling and the first variable frequency generator are matched to the second rotary coupling and the second variable frequency generator such that the first multiphase signal is phase aligned with the second multiphase signal. The aircraft further includes one or more switches coupled to a first electrical system and configured to selectively provide power to the first electrical system based on either the first multiphase signal or the second multiphase signal.

In another particular example, an apparatus includes a first variable frequency generator configured to generate, responsive to an engine, a first multiphase signal. The apparatus further includes a second variable frequency generator configured to generate, responsive to the engine, a second multiphase signal that is phase aligned with the first multiphase signal. The apparatus further includes a controller configured to actuate a first switch to power a first electrical system based on the first multiphase signal. The controller is further configured to actuate a second switch to power the first electrical system based on the second multiphase signal during a non-break power transfer (NBPT) from the first variable frequency generator to the second variable frequency generator.

In another particular example, a method includes generating, by a first variable frequency generator and responsive to an engine, a first multiphase signal. The method further includes generating, by a second variable frequency generator and responsive to the engine, a second multiphase signal that is phase aligned with the first multiphase signal. The method further includes powering an electrical system based on the first multiphase signal and, prior to decoupling the electrical system from first variable frequency generator using a first switch, actuating a second switch to power the electrical system based on the second multiphase signal during an NBPT from the first variable frequency generator to the second variable frequency generator.

DETAILED DESCRIPTION

In accordance with some aspects of the disclosure, an aircraft includes at least a first engine, a first variable frequency generator responsive to the first engine, and a second variable frequency generator that is responsive to the first engine and that is matched to the first variable frequency generator. The first variable frequency generator is configured to generate a first multiphase signal, and the second variable frequency generator is configured to generate a second multiphase signal that is phase aligned with the first multiphase signal. To further illustrate, in some examples, the first variable frequency generator includes a first rotor coupled to the first engine and rotatable at a rate that is based on a rotational rate of the first engine to cause the first variable frequency generator to generate the first multiphase signal. In a particular example, the second variable frequency generator includes a second rotor coupled to the first engine and rotatable at the rate that is based on a rotational rate of the first engine to cause the first variable frequency generator to generate the second multiphase signal phase aligned with the first multiphase signal.

Further, in a particular example, a non-break power transfer (NBPT) is performed using one or more switches. To illustrate, an NBPT from the first variable frequency generator to the second variable frequency generator can be performed by momentarily connecting both the first variable frequency generator and the second variable frequency generator to the first electrical system (e.g., by actuating a first switch). The NBPT can be completed by disconnecting the first variable frequency generator from the electrical system (e.g., by actuating a second switch). By phase matching the first variable frequency generator to the second variable frequency generator, powering of an electrical system of an aircraft can be transferred between the first variable frequency generator and the second variable frequency generator without introducing an abrupt change in voltage, current, frequency, or phase in electrical signals provided to the electrical system. In some implementations, circuitry to "smooth" or eliminate change in voltage, current, frequency, or phase of electrical signals can be reduced or eliminated, decreasing weight of the aircraft (decreasing fuel consumption) and cost associated with design and assembly of the aircraft.

Figure 1:
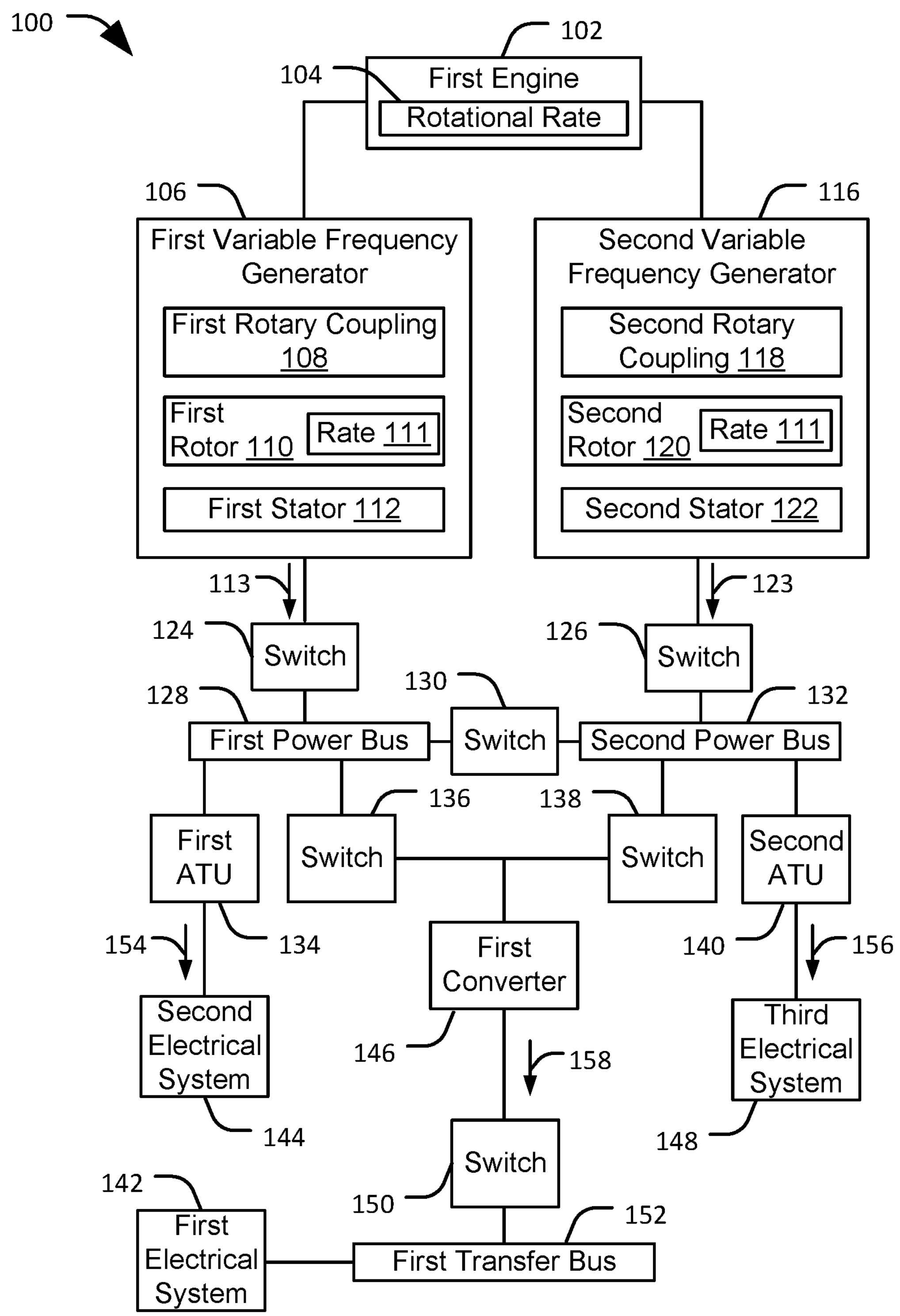
FIG. 1 is a diagram illustrating an example of a system in accordance with aspects of the disclosure.

Referring to FIG. 1, a particular illustrative example of a system is depicted and generally designated 100. In a particular example, the system 100 is included within a vehicle, such as an aircraft.

The system 100 includes an engine or first engine 102 (e.g., an aircraft engine). The system 100 further includes a first variable frequency generator 106 and a second variable frequency generator 116. In a particular example, the first variable frequency generator 106 and the second variable frequency generator 116 each include or correspond to a variable-frequency, constant-voltage generator (VFCVG).

The first variable frequency generator 106 includes a first rotary coupling 108, a first rotor 110, and a first stator 112. The first rotor 110 is coupled to the first engine 102 via the first rotary coupling 108. The first rotor 110 is rotatable at a rate 111 that is based on a rotational rate 104 of the first engine 102 to cause the first variable frequency generator 106 to generate a first multiphase signal 113.

The first multiphase signal 113 includes a plurality of signals having a particular phase relation. To illustrate, in one example, the first multiphase signal 113 corresponds to a three-phase signal that includes three signals having a 120 degree phase relationship. In other implementations, the first multiphase signal 113 can have one or more other characteristics. For example, in other implementations, the first multiphase signal 113 corresponds to a two-phase signal that includes two signals having a 180 degree phase relationship, as an illustrative example.

The second variable frequency generator 116 includes a second rotary coupling 118, a second rotor 120, and a second stator 122. The second rotor 120 is coupled to the first engine 102 via the second rotary coupling 118. The second rotor 120 is rotatable at the rate 111 that is based on the rotational rate 104 of the first engine 102 to cause the second variable frequency generator 116 to generate a second multiphase signal 123.

The second multiphase signal 123 includes a plurality of signals having a particular phase relation. To illustrate, in one example, the second multiphase signal 123 corresponds to a three-phase signal that includes three signals having a 120 degree phase relationship. In other implementations, the second multiphase signal 123 can have one or more other characteristics. For example, in other implementations, the second multiphase signal 123 corresponds to a two-phase signal that includes two signals having a 180 degree phase relationship, as an illustrative example.

The first multiphase signal 113 is phase aligned with the second multiphase signal 123. As used herein, the first multiphase signal 113 is phase aligned with the second multiphase signal 123 if each signal of the first multiphase signal 113 has a common phase with respect to a corresponding signal of the second multiphase signal 123.

To illustrate, in some examples, the first rotary coupling 108 and the first variable frequency generator 106 are matched to the second rotary coupling 118 and the second variable frequency generator 116 such that the first multiphase signal 113 is phase aligned with the second multiphase signal 123. As a particular example, in some implementations, a mounting position and a weight of the first rotor 110 are matched to a mounting position and a weight of the second rotor 120 such that, for a particular position of the first engine 102, both the first rotor 110 and the second rotor 120 have a common position (relative to the first stator 112 and the second stator 122, respectively), resulting in a common phase of the first multiphase signal 113 and the second multiphase signal 123. As used herein, the first rotary coupling 108 and the first variable frequency generator 106 are matched to the second rotary coupling 118 and the second variable frequency generator 116 if an angle between the first rotor 110 and the first stator 112 corresponds to an angle between the second rotor 120 and the second stator 122. It is noted that in some implementations, a position of the first rotor 110 may differ from a position of the second rotor 120 even though the first rotor 110 and the second rotor 120 have a common position relative to the first stator 112 and the second stator 122, respectively.

The system 100 further includes one or more electrical systems configured to receive power from the first variable frequency generator 106, the second variable frequency generator 116, or both. To illustrate, in FIG. 1, the system 100 includes a first electrical system 142, a second electrical system 144, and a third electrical system 148. In some examples, the first electrical system 142 includes one or more components of an aircraft that use constant-frequency power, such as a fan motor of an aircraft, as an illustrative example. In some examples, the second electrical system 144 and the third electrical system 148 include one or more components of an aircraft that are compatible with variable-frequency power, such as AC-based lighting of an aircraft, a window heater of an aircraft, one or more other components of an aircraft, or a combination thereof.

The system 100 further includes a first power bus 128 coupled to the first variable frequency generator 106 and a second power bus 132 coupled to the second variable frequency generator 116. In a particular example, the first power bus 128 is configured to receive the first multiphase signal 113, and the second power bus 132 is configured to receive the second multiphase signal 123. FIG. 1 also illustrates that the system 100 includes a first converter 146 and a first transfer bus 152. The first transfer bus 152 is coupled to the first electrical system 142.

In the example of FIG. 1, the system 100 further includes a first auto-transformer unit (ATU) 134 coupled to the first power bus 128 and to the second electrical system 144. The example of FIG. 1 also depicts that the system 100 includes a second ATU 140 coupled to the second power bus 132 and to the third electrical system 148.

The system 100 includes one or more switches. In a particular example, one or more switches of the system 100 are configured to selectively provide power (e.g., by providing either the first multiphase signal 113 or the second multiphase signal 123) to the first electrical system 142. To illustrate, in FIG. 1, the system 100 includes a switch 124 coupled to the first variable frequency generator 106 and further includes a switch 126 coupled to the second variable frequency generator 116. The system 100 further includes a switch 130 coupled to the first power bus 128 and to the second power bus 132. In a particular example, the second power bus 132 is configured to selectively couple to the first power bus 128 via one or more switches, such as the switch 130. In FIG. 1, the system 100 further includes a switch 136 coupled to the first power bus 128, a switch 138 coupled to the second power bus 132, and a switch 150 coupled to a first transfer bus 152.

During operation, rotation of the first engine 102 causes the first variable frequency generator 106 and the second variable frequency generator 116 to generate the first multiphase signal 113 and the second multiphase signal 123, respectively. The first variable frequency generator 106 and the second variable frequency generator 116 are configured to generate the first multiphase signal 113 and the second multiphase signal 123 based on the rotational rate 104 of the first engine 102. For example, in some implementations, rotation of the first engine 102 causes rotation of the first rotor 110, causing the first stator 112 to generate the first multiphase signal 113. As another example, in some implementations, rotation of the first engine 102 causes rotation of the second rotor 120, causing the second stator 122 to generate the second multiphase signal 123.

In some implementations, the rate 111 is proportional to the rotational rate 104 of the first engine 102. To illustrate, in some examples, the rate 111 corresponds to or varies linearly with the rotational rate 104. In some implementations, the first multiphase signal 113 and the second multiphase signal 123 have a common frequency that is based on the rotational rate 104 of the first engine 102.

Further, a first phase of the first multiphase signal 113 corresponds to a second phase of the second multiphase signal 123. To illustrate, in some implementations, the first rotary coupling 108 and the first variable frequency generator 106 are matched to the second rotary coupling 118 and the second variable frequency generator 116 such that the first multiphase signal 113 is phase aligned with the second multiphase signal 123.

In some examples, the rotational rate 104 of the first engine 102 is variable. For example, in some implementations, the rotational rate 104 can depend on operating conditions, such as whether an aircraft that includes the system 100 is taxiing, taking off, cruising, descending, or landing, as illustrative examples. Due to variation of the rotational rate 104, the rate 111 of the first rotor 110 and the second rotor 120 can vary. As a result, frequency of the first multiphase signal 113 and the second multiphase signal 123 can vary. In a particular illustrative example, frequency of the first multiphase signal 113 and the second multiphase signal 123 has a target of approximately 400 hertz (Hz) and can vary within a particular range (e.g., within a range of 350-800 Hz, as an illustrative example) depending on certain conditions, such as the rotational rate 104 of the first engine 102.

The system 100 includes one or more switches and one or more power buses that are configured to selectively couple, by the one or more switches, to the first variable frequency generator 106 or to the second variable frequency generator 116 to receive a selected variable frequency signal (e.g., the first multiphase signal 113 or the second multiphase signal 123). For example, the first power bus 128 is coupled to receive the first multiphase signal 113 upon actuation of the switch 124. As another example, the second power bus 132 is coupled to receive the second multiphase signal 123 upon actuation of the switch 126. Alternatively or in addition, in some implementations, the first power bus 128 is coupled to receive the second multiphase signal 123 upon actuation of the switches 126, 130 (e.g., while the switch 124 is deactivated), and the second power bus 132 is coupled to receive the first multiphase signal 113 upon actuation of the switches 124, 130 (e.g., while the switch 126 is deactivated).

The first converter 146 is responsive to the first multiphase signal 113, the second multiphase signal 123, or both. For example, in response to actuation of the switch 136, the first converter 146 is coupled to the first power bus 128 and receives the first multiphase signal 113. As another example, in response to actuation of the switch 138, the first converter 146 is coupled to the second power bus 132 and receives the second multiphase signal 123. In certain implementations, the first converter 146 be configured to receive both the first multiphase signal 113 and the second multiphase signal 123 in response to actuation of both the switch 136 and the switch 138.

The first converter 146 is configured to generate a first constant frequency output signal 158 based on the first multiphase signal 113 or the second multiphase signal 123. To illustrate, in some implementations, the first converter 146 is configured to generate the first constant frequency output signal 158 by converting the first multiphase signal 113 or the second multiphase signal 123 to 400 hertz (Hz), as an illustrative example. Alternatively or in addition, in some implementations, the first converter 146 is configured to generate the first constant frequency output signal 158 by modifying a voltage level of the first multiphase signal 113 or the second multiphase signal 123, such as from 230 volts root-mean-square (Vrms) to 115 Vrms. To further illustrate, in a particular example, the first multiphase signal 113 and the second multiphase signal 123 both have variable frequencies and a voltage level of 230 Vrms, and the first constant frequency output signal 158 has a frequency of 400 Hz and a voltage level of 115 Vrms.

The switch 150 is configured to selectively couple an output of the first converter 146 to the first electrical system 142 via the first transfer bus 152. For example, upon actuation of the switch 150, one or more components of the first electrical system 142 may be powered by the first constant frequency output signal 158 via the first transfer bus 152.

Alternatively or in addition to the first electrical system 142, one or both of the second electrical system 144 or the third electrical system 148 can be selectively coupled to the first variable frequency generator 106 or the second variable frequency generator 116 via one or more switches of the system 100. To illustrate, upon actuation of the switch 124 (or upon actuation of the switches 126 and 130), the first ATU 134 is configured to receive the selected variable frequency signal (e.g., the first multiphase signal 113 or the second multiphase signal 123).

The first ATU 134 is configured to convert the selected multiphase signal to a first multiphase output signal 154. For example, in some implementations, the first ATU 134 includes or corresponds to a step-down transformer that is configured to convert signals from 230 Vrms to 115 Vrms. In this particular example, the selected variable frequency signal has a voltage of 230 Vrms, and the first multiphase output signal 154 has a voltage of 115 Vrms.

Upon actuation of the switch 126 (or upon actuation of the switches 124 and 130), the second ATU 140 is configured to receive the selected variable frequency signal (e.g., the first multiphase signal 113 or the second multiphase signal 123). The second ATU 140 is configured to convert the selected multiphase signal to a second multiphase output signal 156. For example, in some implementations, the second ATU 140 includes or corresponds to a step-down transformer that is configured to convert signals from 230 Vrms to 115 Vrms. In this particular example, the selected variable frequency signal has a voltage of 230 Vrms, and the second multiphase output signal 156 has a voltage of 115 Vrms.

In some implementations, one or both of the first multiphase output signal 154 and the second multiphase output signal 156 have a frequency corresponding to a frequency of the first multiphase signal 113 and the second multiphase signal 123. For example, in some implementations, the first multiphase output signal 154, the second multiphase output signal 156, the first multiphase signal 113, and the second multiphase signal 123 have frequencies that vary based on the rotational rate 104 of the first engine 102. The second electrical system 144 is configured to receive the first multiphase output signal 154, and the third electrical system 148 is configured to receive the second multiphase output signal 156.

The system 100 is configured to perform a non-break power transfer (NBPT) from the first variable frequency generator 106 to the second variable frequency generator 116. As used herein, an NBPT from one generator to another generator refers to a power transfer that at least momentarily couples both generators to a load. As used herein, a break power transfer from one generator to another generator refers to a power transfer that does not momentarily couple both generators to a load.

To illustrate, in a first operating state, the first electrical system 142 is powered by the first variable frequency generator 106 instead of the second variable frequency generator 116. In an example of the first operating state, the switches 124, 130, 136, and 150 are activated, and the switches 126, 138 are deactivated. In a particular example, to initiate the NBPT from the first variable frequency generator 106 to the second variable frequency generator 116, the switches 126 and 138 are activated while the first electrical system 142 is coupled to the first variable frequency generator 106 via the switches 124, 136 (e.g., to form a second operating state). As a result, during the NBPT, the first electrical system 142 is connected (at least momentarily) to both the first variable frequency generator 106 and the second variable frequency generator 116. In a particular example, after activating the switches 126, 138, the switches 124, 136 are deactivated to decouple the first electrical system 142 from the first variable frequency generator 106 (e.g., to form a third operating state). Accordingly, the system 100 is configured to perform an NBPT that transfers powering of the first electrical system 142 from the first variable frequency generator 106 to the second variable frequency generator 116. In other examples, the system 100 is configured to perform an NBPT that transfers powering of the first electrical system 142 from the second variable frequency generator 116 to the first variable frequency generator 106 (e.g., where the order of the first operating state, the second operating state, and the third operating state is reversed).

One or more aspects described with reference to FIG. 1 can be used to enable an NBPT between the first variable frequency generator 106 and the second variable frequency generator 116. In some implementations, by matching the first variable frequency generator 106 and the second variable frequency generator 116, the NBPT can be performed without an abrupt change in frequency or phase of signals provided to the first converter 146, to the first electrical system 142, or both. As a result, circuitry to "smooth" or eliminate change in frequency or phase of electrical signals can be reduced or eliminated, decreasing weight of the aircraft (decreasing fuel consumption) and cost associated with design and assembly of the aircraft.

Figure 2:
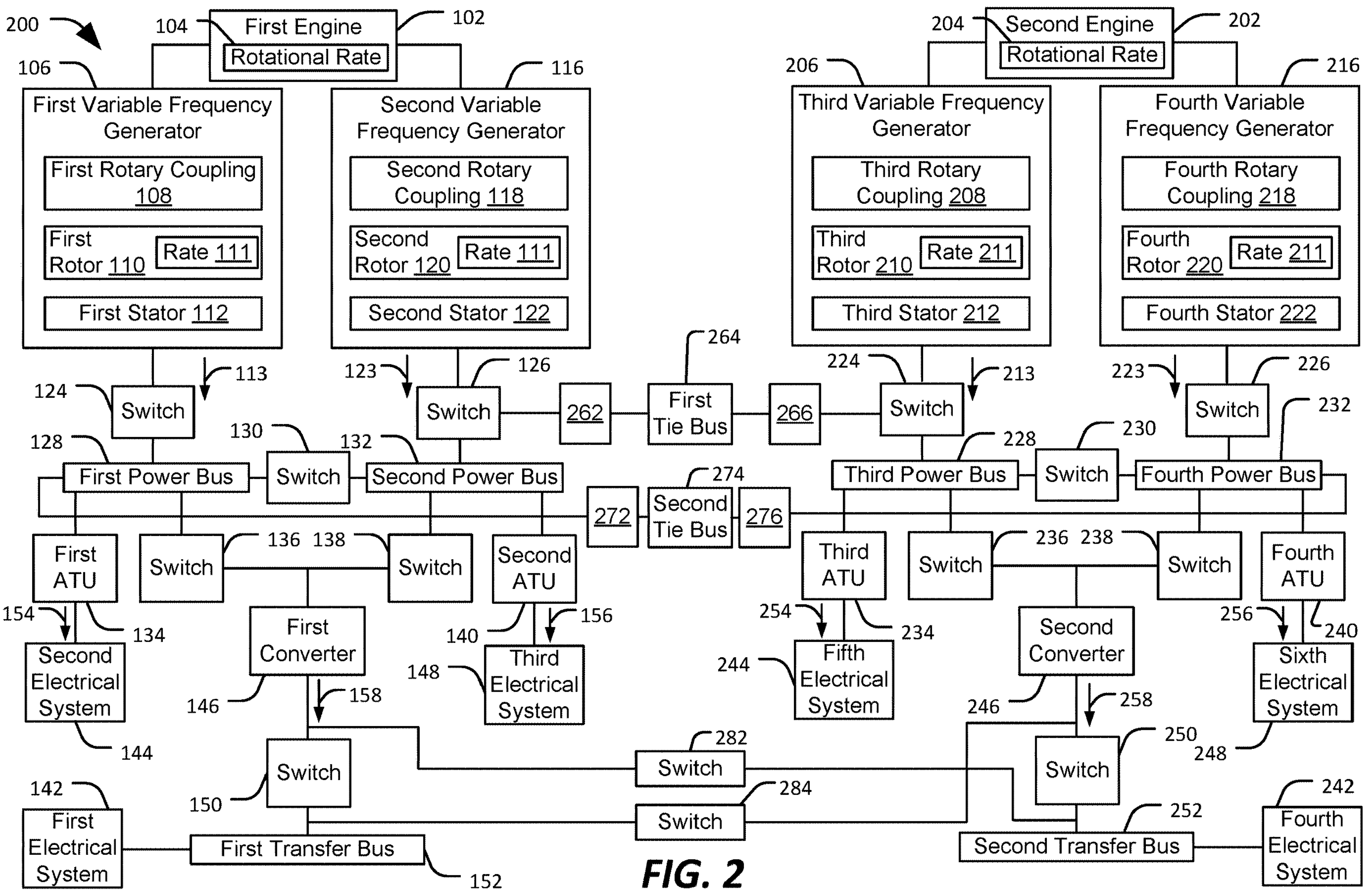
FIG. 2 is a diagram illustrating another example of a system in accordance with aspects of the disclosure.

Referring to FIG. 2, another illustrative example of a system is depicted and generally designated 200. The system 200 includes certain components and features described with reference to the system 100 of FIG. 1.

In addition, the system 200 of FIG. 2 further includes a second engine 202 (e.g., an aircraft engine). The system 200 further includes a third variable frequency generator 206 and a fourth variable frequency generator 216. In a particular example, the third variable frequency generator 206 and the fourth variable frequency generator 216 each include or correspond to a VFCVG.

The third variable frequency generator 206 includes a third rotary coupling 208, a third rotor 210, and a third stator 212. The third rotor 210 is coupled to the second engine 202 via the third rotary coupling 208. The third rotor 210 is rotatable at a second rate 211 that is based on a second rotational rate 204 of the second engine 202 to cause the third variable frequency generator 206 to generate a third multiphase signal 213.

The third multiphase signal 213 includes a plurality of signals having a particular phase relation. To illustrate, in one example, the third multiphase signal 213 corresponds to a three-phase signal that includes three signals having a 120 degree phase relationship. In other implementations, the third multiphase signal 213 can have one or more other characteristics. For example, in other implementations, the third multiphase signal 213 corresponds to a two-phase signal that includes two signals having a 180 degree phase relationship, as an illustrative example.

The fourth variable frequency generator 216 includes a fourth rotary coupling 218, a fourth rotor 220, and a fourth stator 222. The fourth rotor 220 is coupled to the second engine 202 via the fourth rotary coupling 218. The fourth rotor 220 is rotatable at the second rate 211 that is based on the second rotational rate 204 of the second engine 202 to cause the fourth variable frequency generator 216 to generate a fourth multiphase signal 223.

The fourth multiphase signal 223 includes a plurality of signals having a particular phase relation. To illustrate, in one example, the fourth multiphase signal 223 corresponds to a three-phase signal that includes three signals having a 120 degree phase relationship. In other implementations, the fourth multiphase signal 223 can have one or more other characteristics. For example, in other implementations, the fourth multiphase signal 223 corresponds to a two-phase signal that includes two signals having a 180 degree phase relationship, as an illustrative example.

The third multiphase signal 213 is phase aligned with the fourth multiphase signal 223. As used herein, the third multiphase signal 213 is phase aligned with the fourth multiphase signal 223 if each signal of the third multiphase signal 213 has a common phase with a respective signal of the fourth multiphase signal 223.

To illustrate, in some examples, the third rotary coupling 208 and the third variable frequency generator 206 are matched to the fourth rotary coupling 218 and the fourth variable frequency generator 216 such that the third multiphase signal 213 is phase aligned with the fourth multiphase signal 223. As a particular example, in some implementations, a mounting position and a weight of the third rotor 210 are matched to a mounting position and a weight of the fourth rotor 220 such that, for a particular position of the second engine 202, both the third rotor 210 and the fourth rotor 220 have a common position (relative to the third stator 212 and the fourth stator 222, respectively), resulting in a common phase of the third multiphase signal 213 and the fourth multiphase signal 223. As used herein, the third rotary coupling 208 and the third variable frequency generator 206 are matched to the fourth rotary coupling 218 and the fourth variable frequency generator 216 if an angle between the third rotor 210 and the third stator 212 corresponds to an angle between the fourth rotor 220 and the fourth stator 222. It is noted that in some implementations, a position of the third rotor 210 may differ from a position of the fourth rotor 220 even though the third rotor 210 and the fourth rotor 220 have a common position relative to the third stator 212 and the fourth stator 222, respectively.

The system 200 further includes one or more electrical systems configured to receive power from the third variable frequency generator 206, the fourth variable frequency generator 216, or both. To illustrate, in FIG. 2, the system 200 includes a fourth electrical system 242, a fifth electrical system 244, and a sixth electrical system 248. In some examples, the fourth electrical system 242 includes one or more components of an aircraft that are compatible with constant-frequency power, such as a fan motor of an aircraft, as an illustrative example. In some examples, the fifth electrical system 244 and the sixth electrical system 248 include one or more components of an aircraft that are compatible with variable-frequency power, such as AC-based lighting of an aircraft, a window heater of an aircraft, one or more other components of an aircraft, or a combination thereof.

The system 200 further includes a third power bus 228 and a fourth power bus 232. In a particular example, the third power bus 228 is configured to receive the third multiphase signal 213, and the fourth power bus 232 is configured to receive the fourth multiphase signal 223. FIG. 2 also illustrates that the system 200 includes a second converter 246 and a second transfer bus 252. The second transfer bus 252 is coupled to the fourth electrical system 242.

In the example of FIG. 2, the system 200 further includes a third ATU 234 coupled to the third power bus 228 and to the fifth electrical system 244. The example of FIG. 2 also depicts that the system 200 includes a fourth ATU 240 coupled to the fourth power bus 232 and to the sixth electrical system 248.

The system 200 includes one or more switches. In a particular example, one or more switches of the system 200 are configured to selectively provide power (e.g., by providing either the third multiphase signal 213 or the fourth multiphase signal 223) to the fourth electrical system 242. To illustrate, in FIG. 2, the system 200 includes a switch 224 coupled to the third variable frequency generator 206 and further includes a switch 226 coupled to the fourth variable frequency generator 216. The system 200 further includes a switch 230 coupled to the third power bus 228 and to the fourth power bus 232. In FIG. 2, the system 200 further includes a switch 236 coupled to the third power bus 228, a switch 238 coupled to the fourth power bus 232, and a switch 250 coupled to a second transfer bus 252.

FIG. 2 also depicts that the system 200 includes a first tie bus 264 and a second tie bus 274. The first tie bus 264 is coupled to the switch 126 via a switch 262 and to the switch 224 via a switch 266. The second tie bus 274 is coupled to the first power bus 128 via a switch 272 and to the fourth power bus via a switch 276.

In the example of FIG. 2, the system 200 further includes a first transfer switch 282 coupled to an output of the first converter 146 and to an input of the second transfer bus 252. FIG. 2 also illustrates that the system 200 includes a second transfer switch 284 coupled to an output of the second converter 246 and to an input of the first transfer bus 152.

The system 200 also includes one or more second switches coupled to the fourth electrical system 242 and configured to selectively power the fourth electrical system 242 based on either the third multiphase signal 213 or the fourth multiphase signal 223. For example, in some implementations, the one or more second switches include or correspond to the switches 224, 226, 236, and 238.

During operation, rotation of the second engine 202 causes the third variable frequency generator 206 and the fourth variable frequency generator 216 to generate the third multiphase signal 213 and the fourth multiphase signal 223, respectively. The third variable frequency generator 206 and the fourth variable frequency generator 216 are configured to generate the third multiphase signal 213 and the fourth multiphase signal 223 based on the second rotational rate 204 of the second engine 202. For example, in some implementations, rotation of the second engine 202 causes rotation of the third rotor 210, causing the third stator 212 to generate the third multiphase signal 213. As another example, in some implementations, rotation of the second engine 202 causes rotation of the fourth rotor 220, causing the fourth stator 222 to generate the fourth multiphase signal 223. In some cases, rotation of the second engine 202 may vary with respect to rotation of the first engine 102 (e.g., the second rotational rate 204 is controlled independently of the rotational rate 104).

In some implementations, the second rate 211 is proportional to the second rotational rate 204 of the second engine 202. To illustrate, in some examples, the second rate 211 corresponds to or varies linearly with the second rotational rate 204. In some implementations, the third multiphase signal 213 and the fourth multiphase signal 223 have a common frequency that is based on the second rotational rate 204 of the second engine 202.

Further, a first phase of the third multiphase signal 213 corresponds to a second phase of the fourth multiphase signal 223. To illustrate, in some implementations, the third rotary coupling 208 and the third variable frequency generator 206 are matched to the fourth rotary coupling 218 and the fourth variable frequency generator 216 such that the third multiphase signal 213 is phase aligned with the fourth multiphase signal 223.

In some examples, the second rotational rate 204 of the second engine 202 is variable. For example, in some implementations, the second rotational rate 204 can depend on operating conditions, such as whether an aircraft that includes the system 200 is taxiing, taking off, cruising, descending, or landing, as illustrative examples. Due to variation of the second rotational rate 204, the second rate 211 can vary. As a result, frequency of the third multiphase signal 213 and the fourth multiphase signal 223 can vary. In a particular illustrative example, frequency of the third multiphase signal 213 and the fourth multiphase signal 223 has a target of approximately 400 hertz (Hz) and can vary within a particular range (e.g., within a range of 350-800 Hz, as an illustrative example) depending on certain conditions, such as the second rotational rate 204 of the second engine 202.

The system 200 includes one or more switches and one or more power buses that are configured to selectively couple, by the one or more switches, to the third variable frequency generator 206 or to the fourth variable frequency generator 216 to receive a selected variable frequency signal (e.g., the third multiphase signal 213 or the fourth multiphase signal 223). For example, the third power bus 228 is coupled to receive the third multiphase signal 213 upon actuation of the switch 224. As another example, the fourth power bus 232 is coupled to receive the fourth multiphase signal 223 upon actuation of the switch 226. Alternatively or in addition, in some implementations, the third power bus 228 is coupled to receive the fourth multiphase signal 223 upon actuation of the switches 226, 230 (e.g., while the switch 224 is deactivated), and the fourth power bus 232 is coupled to receive the third multiphase signal 213 upon actuation of the switches 224, 230 (e.g., while the switch 226 is deactivated).

The second converter 246 is responsive to the third multiphase signal 213, the fourth multiphase signal 223, or both. For example, in response to actuation of the switch 236, the second converter 246 is coupled to the third power bus 228 and receives the third multiphase signal 213. As another example, in response to actuation of the switch 238, the second converter 246 is coupled to the fourth power bus 232 and receives the fourth multiphase signal 223. In certain implementations, the second converter 246 is can be configured to receive both the third multiphase signal 213 and the fourth multiphase signal 223 in response to actuation of both the switch 236 and the switch 238.

The second converter 246 is configured to generate a second constant frequency output signal 258 based on the third multiphase signal 213 or the fourth multiphase signal 223. To illustrate, in some implementations, the second converter 246 is configured to generate the second constant frequency output signal 258 by converting the third multiphase signal 213 or the fourth multiphase signal 223 to 400 hertz (Hz), as an illustrative example. Alternatively or in addition, in some implementations, the second converter 246 is configured to generate the second constant frequency output signal 258 by modifying a voltage level of the third multiphase signal 213 or the fourth multiphase signal 223, such as from 230 Vrms to 115 Vrms. To further illustrate, in a particular example, the third multiphase signal 213 and the fourth multiphase signal 223 both have variable frequencies and a voltage level of 230 Vrms, and the second constant frequency output signal 258 has a frequency of 400 Hz and a voltage level of 115 Vrms.

The switch 250 is configured to selectively couple an output of the second converter 246 to the fourth electrical system 242 via the second transfer bus 252. For example, upon actuation of the switch 250, one or more components of the fourth electrical system 242 may be powered by the second constant frequency output signal 258 via the second transfer bus 252.

Alternatively or in addition to the fourth electrical system 242, one or both of the fifth electrical system 244 or the sixth electrical system 248 can be selectively coupled to the third variable frequency generator 206 or the fourth variable frequency generator 216 via one or more switches of the system 200. To illustrate, upon actuation of the switch 224 (or upon actuation of the switches 226 and 230), the third ATU 234 is configured to receive the selected variable frequency signal (e.g., the third multiphase signal 213 or the fourth multiphase signal 223).

The third ATU 234 is configured to convert the selected multiphase signal to a third multiphase output signal 254. For example, in some implementations, the third ATU 234 includes or corresponds to a step-down transformer that is configured to convert signals from 230 Vrms to 115 Vrms. In this particular example, the selected variable frequency signal has a voltage of 230 Vrms, and the third multiphase output signal 254 has a voltage of 115 Vrms.

Upon actuation of the switch 226 (or upon actuation of the switches 224 and 230), the fourth ATU 240 is configured to receive the selected variable frequency signal (e.g., the third multiphase signal 213 or the fourth multiphase signal 223). The fourth ATU 240 is configured to convert the selected multiphase signal to a fourth multiphase output signal 256. For example, in some implementations, the fourth ATU 240 includes or corresponds to a step-down transformer that is configured to convert signals from 230 Vrms to 115 Vrms. In this particular example, the selected variable frequency signal has a voltage of 230 Vrms, and the fourth multiphase output signal 256 has a voltage of 115 Vrms.

In some implementations, one or both of the third multiphase output signal 254 and the fourth multiphase output signal 256 have a frequency corresponding to a frequency of the third multiphase signal 213 and the fourth multiphase signal 223. For example, in some implementations, the third multiphase output signal 254, the fourth multiphase output signal 256, the third multiphase signal 213, and the fourth multiphase signal 223 have frequencies that vary based on the second rotational rate 204 of the second engine 202. The fifth electrical system 244 is configured to receive the third multiphase output signal 254, and the sixth electrical system 248 is configured to receive the fourth multiphase output signal 256.

In addition to the NBPT between the variable frequency generators 106, 116 described with reference to FIG. 1, in some examples, the system 200 is configured to perform an NBPT between the third variable frequency generator 206 and the fourth variable frequency generator 216. To illustrate, in a first operating state, the fourth electrical system 242 is powered by the third variable frequency generator 206 instead of the fourth variable frequency generator 216. In an example of the first operating state, the switches 224, 230, 236, and 250 are activated, and the switches 226, 238 are deactivated. In a particular example, to initiate the NBPT from the third variable frequency generator 206 to the fourth variable frequency generator 216, the switches 226 and 238 are activated while the fourth electrical system 242 is coupled to the third variable frequency generator 206 via the switches 224, 236 (e.g., to form a second operating state). As a result, during the NBPT, the fourth electrical system 242 is connected (at least momentarily) to both the third variable frequency generator 206 and the fourth variable frequency generator 216. In a particular example, after activating the switches 226, 238, the switches 224, 236 are deactivated to decouple the fourth electrical system 242 from the third variable frequency generator 206 (e.g., to form a third operating state). Accordingly, the system 200 is configured to perform an NBPT that transfers powering of the first electrical system 142 from the first variable frequency generator 106 to the second variable frequency generator 116 (or vice versa), an NBPT that transfers powering of the fourth electrical system 242 from the third variable frequency generator 206 to the fourth variable frequency generator 216 (or vice versa), or both.

Alternatively or in addition, in some examples, the system 200 is configured to perform an NBPT that transfers powering of an electrical system (e.g., the first electrical system 142 or the fourth electrical system 242) between the variable frequency generators 106, 116 (or between the variable frequency generators 206, 216) using the switches 150, 250, 282, and 284. For example, in some implementations, the first transfer switch 282 is configured to selectively provide, based on a particular state of the first transfer switch 282, the first constant frequency output signal 158 to the second transfer bus 252, and the second transfer switch 284 is configured to selectively provide, based on a particular state of the second transfer switch 284, the second constant frequency output signal 258 to the first transfer bus 152 during an NBPT from the first transfer bus 152 to the second transfer bus 252.

To further illustrate, in some implementations, the first transfer switch 282 is configured to selectively provide, based on a particular state of the first transfer switch 282, the first constant frequency output signal 158 to the second transfer bus 252. In a particular example, the second transfer switch 284 is configured to selectively provide, based on a particular state of the second transfer switch 284, the second constant frequency output signal 258 to the first transfer bus 152 during an NBPT from the first transfer bus 152 to the second transfer bus 252. Accordingly, the system 200 can be configured to perform an NBPT that transfers powering of an electrical system (e.g., the first electrical system 142 or the fourth electrical system 242) from one or more of the variable frequency generators 106, 116 to one or more of the variable frequency generators 206, 216 (or vice versa).

Alternatively or in addition, in some examples, the system 200 is configured to perform a break power transfer between generators of different engines. For example, the break power transfer can transfer powering of an electrical system (e.g., the first electrical system 142 or the fourth electrical system 242) from one or more of the variable frequency generators 106, 116 to one or more of the variable frequency generators 206, 216 (or vice versa). To illustrate, in some implementations, the first tie bus 264 is configured to enable a break power transfer from the second power bus 132 to the third power bus 228 (or vice versa). To illustrate, the break power transfer can cause the first electrical system 142 to receive power from the third variable frequency generator 206 (instead of from the second variable frequency generator 116) by selectively coupling the first electrical system 142 to the fourth variable frequency generator 216 via the third power bus 228. In some implementations, the second tie bus 274 is configured to enable a break power transfer from the first power bus 128 to the fourth power bus 232 (or vice versa). For example, the break power transfer can cause the fourth electrical system 242 to receive power from the fourth variable frequency generator 216 (instead of from the first variable frequency generator 106) by selectively coupling the fourth electrical system 242 to the fourth variable frequency generator 216 via the fourth power bus 232.

One or more aspects described with reference to FIG. 2 can be used to enable an NBPT between the first variable frequency generator 106 and the second variable frequency generator 116, between the third variable frequency generator 206 and the fourth variable frequency generator 216, or both. In some implementations, by matching the first variable frequency generator 106 and the second variable frequency generator 116, the NBPT can be performed without an abrupt change in frequency or phase of signals provided to the first converter 146, to the first electrical system 142, or both. In some implementations, by matching the third variable frequency generator 206 and the fourth variable frequency generator 216, the NBPT can be performed without an abrupt change in frequency or phase of signals provided to the second converter 246, to the fourth electrical system 242, or both. As a result, circuitry to "smooth" or eliminate change in frequency or phase of electrical signals can be reduced or eliminated, decreasing weight of the aircraft (decreasing fuel consumption) and cost associated with design and assembly of the aircraft. Alternatively or in addition, one or more aspects of FIG. 2 can be used to perform another NBPT or a break power transfer, such as by using the transfer switches 282, 284 to perform an NBPT, by using the tie buses 264, 274 to perform a break power transfer between generators of different engines, or both.

Figure 3:
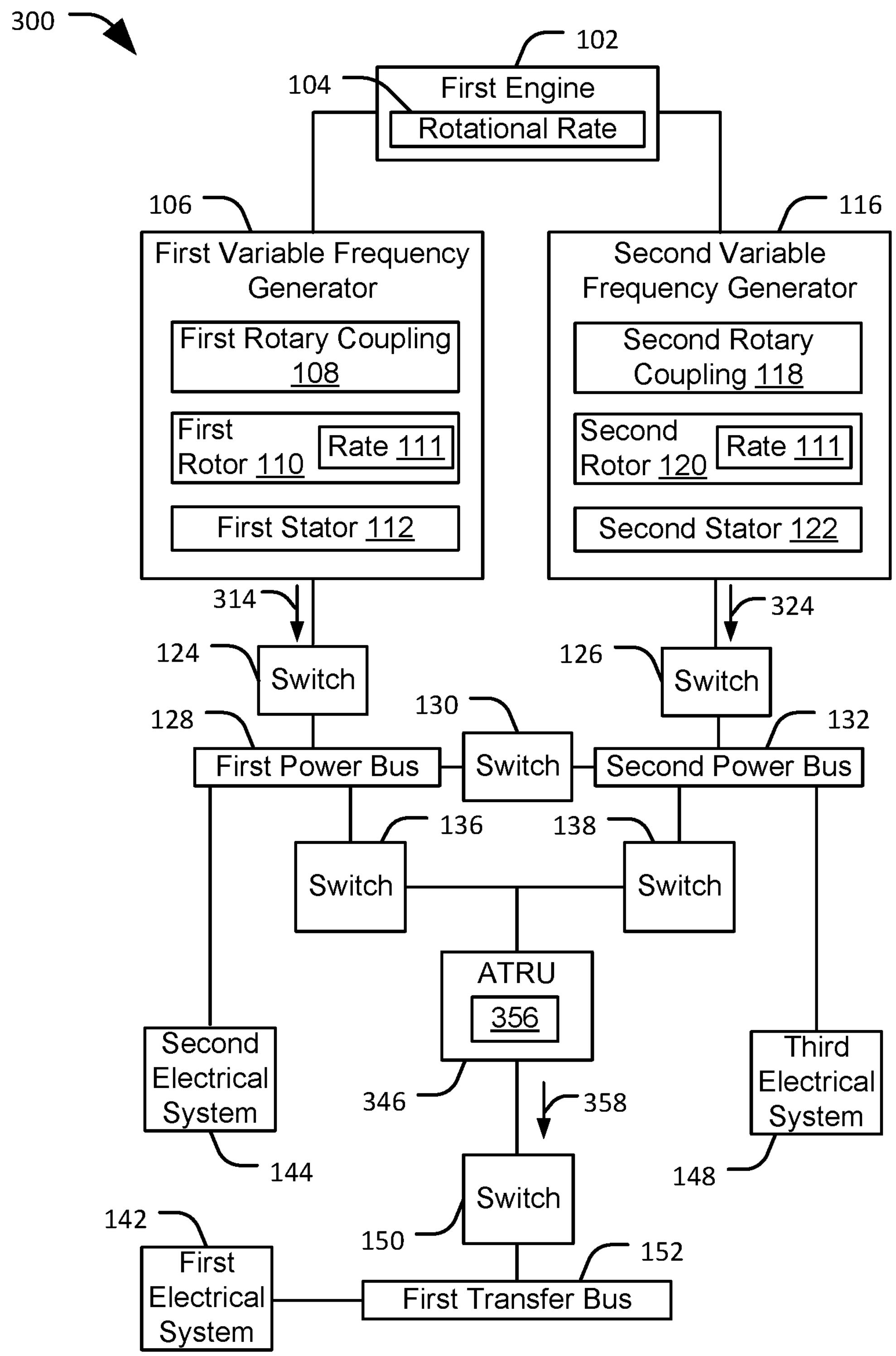
FIG. 3 is a diagram illustrating another example of a system in accordance with aspects of the disclosure.

Referring to FIG. 3, another particular example of a system is depicted and generally designated 300. The system 300 includes certain components and features described with reference to the system 100 of FIG. 1.

In the particular example of FIG. 3, the first variable frequency generator 106 is configured to generate, in response to rotation of the first engine 102, a first multiphase signal 314. Further, in the example of FIG. 3, the second variable frequency generator 116 is configured to generate, in response to rotation of the first engine 102, a second multiphase signal 324.

The first multiphase signal 314 is phase aligned with the second multiphase signal 324. As used herein, the first multiphase signal 314 is phase aligned with the second multiphase signal 324 if each signal of the first multiphase signal 314 has a common phase with a respective signal of the second multiphase signal 324.

To illustrate, in some examples, the first rotary coupling 108 and the first variable frequency generator 106 are matched to the second rotary coupling 118 and the second variable frequency generator 116 such that the first multiphase signal 314 is phase aligned with the second multiphase signal 324. As a particular example, in some implementations, a mounting position and a weight of the first rotor 110 are matched to a mounting position and a weight of the second rotor 120 such that, for a particular position of the first engine 102, both the first rotor 110 and the second rotor 120 have a common position (relative to the first stator 112 and the second stator 122, respectively), resulting in a common phase of the first multiphase signal 314 and the second multiphase signal 324.

In a particular example, the multiphase signals 314, 324 have a voltage level different than a voltage level of the multiphase signals 113, 123 of FIG. 1. To illustrate, in one example, the multiphase signals 314, 324 have a voltage level of 115 Vrms, and the multiphase signals 113, 123 of FIG. 1 have a voltage level of 230 Vrms.

In some implementations, use of 115 Vrms signals as described with reference to FIG. 3 can reduce or avoid use of certain transformers included in systems that use 230 Vrms signals. For example, in FIG. 3, the first power bus 128 is directly coupled to the second electrical system 144 (without use of the first ATU 134 of FIG. 1), and the second power bus 132 is directly coupled to the third electrical system 148 (without use of the second ATU 140 of FIG. 1). It is also noted that in some implementations, use of 115 Vrms signals as described with reference to FIG. 3 can increase size or weight of certain components as compared to systems that use 230 Vrms signals. To illustrate, use of 115 Vrms signals may involve increasing a size of certain electrical wiring components (e.g., "feeders" of an aircraft) to reduce loss associated with lower voltage and higher current signals.

In the example of FIG. 3, the system 300 includes an auto-transformer and rectifier unit (ATRU) 346. The ATRU 346 is coupled to the first power bus 128 via the switch 136 and to the second power bus 132 via the switch 138. The ATRU 346 is also coupled to the first transfer bus 152 via the switch 150.

During operation, the system 300 is configured to select a multiphase signal (e.g., the first multiphase signal 314 or the second multiphase signal 324) and to provide the selected multiphase signal to the ATRU 346. For example, the system 300 is configured to select the first multiphase signal 314 in response to actuation of the switches 124, 136 or in response to actuation of the switches 124, 130, and 138. As another example, the system 300 is configured to select the second multiphase signal 324 in response to actuation of the switches 126, 138 or in response to actuation of the switches 126, 130, and 136.

The ATRU 346 is configured to generate a constant-frequency output signal 358 based on the selected multiphase signal. As a particular example, the ATRU 346 is configured to generate the constant-frequency output signal 358 based on the first multiphase signal 314 in response to actuation of the switches 124, 136 or in response to actuation of the switches 124, 130, and 138. As another example, the ATRU 346 is configured to generate the constant-frequency output signal 358 based on the second multiphase signal 324 in response to actuation of the switches 126, 138 or in response to actuation of the switches 126, 130, and 136.

In some examples, the first multiphase signal 314 and the second multiphase signal 324 both have variable frequencies, and the constant frequency output signal 358 has a constant frequency. As a particular example, in some implementations, the constant frequency output signal 358 has a frequency of 400 Hz and a voltage of 115 Vrms.

In some implementations, the ATRU 346 is configured to step up a voltage level of the selected multiphase signal to an "intermediate" signal having a voltage level greater than the voltage level of the selected multiphase signal. For example, in some designs, direct conversion from a variable frequency signal to a constant variable frequency signal may be infeasible without voltage loss (e.g., due to loss associated with operation of circuit components). As a result, in some implementations, the ATRU 346 has a "step up then step down" configuration. To further illustrate, in a particular example, the ATRU 346 is configured to convert the selected multiphase signal to a direct-current (DC) signal 356 and to convert the DC signal 356 to the constant-frequency output signal 358. In one example, the first multiphase signal 314, the second multiphase signal 324, and the constant-frequency output signal 358 each have a voltage of 115 Vrms, and the DC signal 356 has a voltage of more than 115 volts DC, such as 200 volts DC (Vdc), as an illustrative example. In this example, the ATRU 346 is configured to step up and rectify the selected multiphase signal from 115 Vrms to 200 Vdc and to step down and invert the DC signal 356 from 200 Vdc to 115 Vrms to generate the constant-frequency output signal 358.

The example of FIG. 3 illustrates that aspects of the disclosure can be utilized in connection with a 115 Vrms implementation of the variable frequency generators 106, 116. In this case, the first power bus 128 can be directly coupled to the second electrical system 144 (without use of the first ATU 134 of FIG. 1), and the second power bus 132 can be directly coupled to the third electrical system 148 (without use of the second ATU 140 of FIG. 1), which can reduce weight or cost of an aircraft in some implementations.

Figure 4:
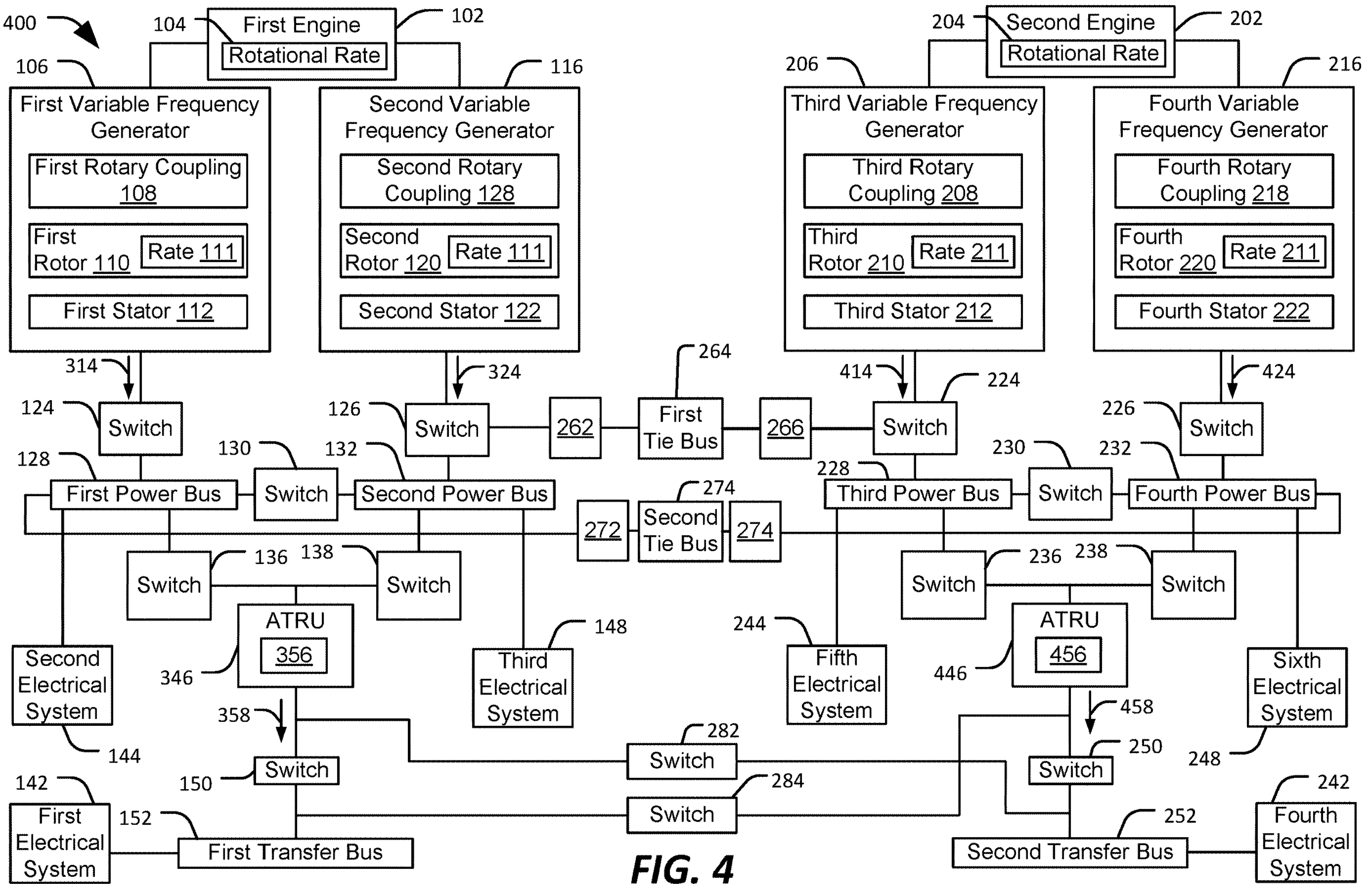
FIG. 4 is a diagram illustrating another example of a system in accordance with aspects of the disclosure.

Referring to FIG. 4, another particular example of a system is depicted and generally designated 400. The system 400 includes certain components and features described with reference to the system 200 of FIG. 2 and the system 300 of FIG. 3.

In the particular example of FIG. 4, the third variable frequency generator 206 is configured to generate, in response to rotation of the second engine 202, a third multiphase signal 414. Further, in the example of FIG. 4, the fourth variable frequency generator 216 is configured to generate, in response to rotation of the second engine 202, a fourth multiphase signal 424.

The third multiphase signal 414 is phase aligned with the fourth multiphase signal 424. As used herein, the third multiphase signal 414 is phase aligned with the fourth multiphase signal 424 if each signal of the third multiphase signal 414 has a common phase with respect to a corresponding signal of the fourth multiphase signal 424.

To illustrate, in some examples, the third rotary coupling 208 and the third variable frequency generator 206 are matched to the fourth rotary coupling 218 and the fourth variable frequency generator 216 such that the third multiphase signal 414 is phase aligned with the fourth multiphase signal 424. As a particular example, in some implementations, a mounting position and a weight of the third rotor 210 are matched to a mounting position and a weight of the fourth rotor 220 such that, for a particular position of the second engine 202, both the third rotor 210 and the fourth rotor 220 have a common position (relative to the third stator 212 and the fourth stator 222, respectively), resulting in a common phase of the third multiphase signal 414 and the fourth multiphase signal 424.

In a particular example, the multiphase signals 414, 424 have a voltage level different than a voltage level of the multiphase signals 213, 223 of FIG. 2. To illustrate, in one example, the multiphase signals 414, 424 have a voltage level of 115 Vrms, and the multiphase signals 213, 223 of FIG. 2 have a voltage level of 230 Vrms.

In the example of FIG. 4, the system 400 includes an ATRU 446. The ATRU 446 is coupled to the third power bus 228 via the switch 236 and to the fourth power bus 232 via the switch 238. The ATRU 446 is also coupled to the second transfer bus 252 via the switch 250.

During operation, the system 400 is configured to select a multiphase signal (e.g., the third multiphase signal 414 or the fourth multiphase signal 424) and to provide the selected multiphase signal to the ATRU 446. For example, the system 400 is configured to select the third multiphase signal 414 in response to actuation of the switches 224, 236 or in response to actuation of the switches 224, 230, and 238. As another example, the system 400 is configured to select the fourth multiphase signal 424 in response to actuation of the switches 226, 238 or in response to actuation of the switches 226, 230, and 236.

The ATRU 446 is configured to generate a constant-frequency output signal 458 based on the selected multiphase signal. As a particular example, the ATRU 446 is configured to generate the constant-frequency output signal 458 based on the third multiphase signal 414 in response to actuation of the switches 224, 236 or in response to actuation of the switches 224, 230, and 238. As another example, the ATRU 446 is configured to generate the constant-frequency output signal 458 based on the fourth multiphase signal 424 in response to actuation of the switches 226, 238 or in response to actuation of the switches 226, 230, and 236.

In some examples, the third multiphase signal 414 and the fourth multiphase signal 424 both have variable frequencies, and the constant frequency output signal 458 has a constant frequency. As a particular example, in some implementations, the constant frequency output signal 458 has a frequency of 400 Hz and a voltage of 115 Vrms.

In some implementations, the ATRU 446 is configured to step up a voltage level of the selected multiphase signal to an "intermediate" signal having a voltage level greater than the voltage level of the selected multiphase signal. For example, in some designs, direct conversion from a variable frequency signal to a constant variable frequency signal may be infeasible without voltage loss (e.g., due to loss associated with operation of circuit components). As a result, in some implementations, the ATRU 446 has a "step up then step down" configuration. To further illustrate, in a particular example, the ATRU 446 is configured to convert the selected multiphase signal to a DC signal 456 and to convert the DC signal 456 to the constant-frequency output signal 458. In one example, the third multiphase signal 414, the fourth multiphase signal 424, and the constant-frequency output signal 458 each have a voltage of 115 Vrms, and the DC signal 456 has a voltage of more than 115 volts DC, such as 200 Vdc, as an illustrative example. In this example, the ATRU 446 is configured to step up and rectify the selected multiphase signal from 115 Vrms to 200 Vdc and to step down and invert the DC signal 456 from 200 Vdc to 115 Vrms to generate the constant-frequency output signal 458.

The example of FIG. 4 illustrates that aspects of the disclosure can be utilized in connection with a 115 Vrms implementation of the variable frequency generators 106, 116, the variable frequency generators 206, 216, or both. In this case, the first power bus 128 can be directly coupled to the second electrical system 144 (without use of the first ATU 134 of FIG. 1), and the second power bus 132 can be directly coupled to the third electrical system 148 (without use of the second ATU 140 of FIG. 1), which can reduce weight or cost of an aircraft in some implementations. Alternatively or in addition, the third power bus 228 can be directly coupled to the fifth electrical system 244, and the fourth power bus 232 can be directly coupled to the sixth electrical system 248, reducing weight or cost of an aircraft in some implementations.

Figure 5:
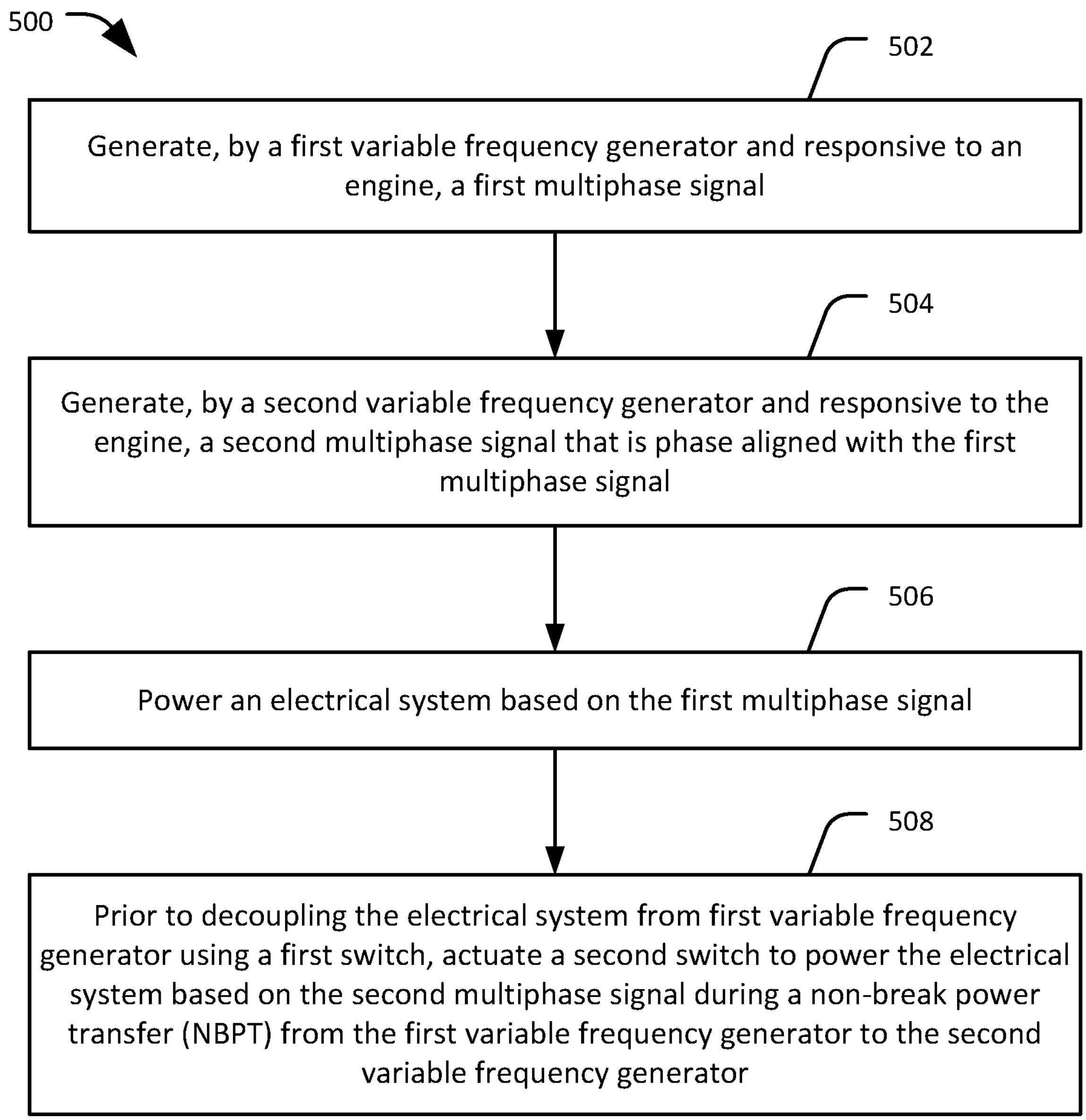
FIG. 5 is a flow chart of an example of a method of operating the system of FIG. 1, the system of FIG. 2, the system of FIG. 3, or the system of FIG. 4.

Referring to FIG. 5, a particular example of a method is depicted and generally designated 500. In some examples, operations of the method are performed by the system 100 of FIG. 1. Alternatively or in addition, in some examples, operations of the method 500 are performed by the system 200 of FIG. 2, the system 300 of FIG. 3, the system 400 of FIG. 4, or a combination thereof.

The method 500 includes generating, by a first variable frequency generator and responsive to an engine, a first multiphase signal, at 502. In one example, the first variable frequency generator 106 is configured to generate the first multiphase signal 113 responsive to the first engine 102.

The method 500 further includes generating, by a second variable frequency generator and responsive to the engine, a second multiphase signal that is phase aligned with the first multiphase signal, at 504. In a particular example, the second variable frequency generator 116 is responsive to the engine 102 to generate the second multiphase signal 123, and the second multiphase signal 123 is phase aligned with the first multiphase signal 113.

The method 500 further includes powering an electrical system based on the first multiphase signal, at 506. In a particular example, the first electrical system 142 is powered based on the first multiphase signal 113.

The method 500 further includes, prior to decoupling the electrical system from first variable frequency generator using a first switch (e.g., the switch 124 or the switch 136), actuating a second switch (e.g., the switch 126 or the switch 138) to power the electrical system based on the second multiphase signal during a non-break power transfer (NBPT) from the first variable frequency generator to the second variable frequency generator, at 508. For example, in some implementations, the first electrical system 142 is powered based on the first multiphase signal 113 while the first variable frequency generator 106 is coupled to the first electrical system 142 via the switch 124 and the switch 136. In one example, prior to decoupling the first electrical system 142 from the first variable frequency generator 106, the switch 126 and the switch 138 are actuated to power the first electrical system 142 based on the second multiphase signal 123 during an NBPT from the first variable frequency generator 106 to the second variable frequency generator 116.

In a particular example of the method 500, during the NBPT, the first variable frequency generator powers the electrical system based on the first multiphase signal via the first switch and the second variable frequency generator powers the electrical system based on the second multiphase signal via the second switch. For example, in some implementations, the first variable frequency generator 106 is configured to power the first electrical system 142 based on the first multiphase signal 113 via the switch 124 or the switch 136, and the second variable frequency generator 116 is configured to power the first electrical system 142 based on the second multiphase signal 123 via the switch 126 or the switch 138.

In a particular example, the method 500 further includes, after performing the NBPT, decoupling the electrical system from the first variable frequency generator using the first switch. As a particular example, in some implementations, the first electrical system 142 can be decoupled, after performance of the NBPT, from the first variable frequency generator 106 using the switch 124 or the switch 136.

One or more aspects of FIG. 5 can reduce weight or cost associated with a vehicle, such as an aircraft. For example, by phase matching the first variable frequency generator to the second variable frequency generator, powering of an electrical system can be transferred without introducing an abrupt change in frequency or phase of electrical signals provided to the electrical system. In some implementations, circuitry to "smooth" or eliminate change in frequency or phase of electrical signals can be reduced or eliminated, decreasing weight of the aircraft (decreasing fuel consumption) and cost associated with design and assembly of the aircraft.

Figure 6:
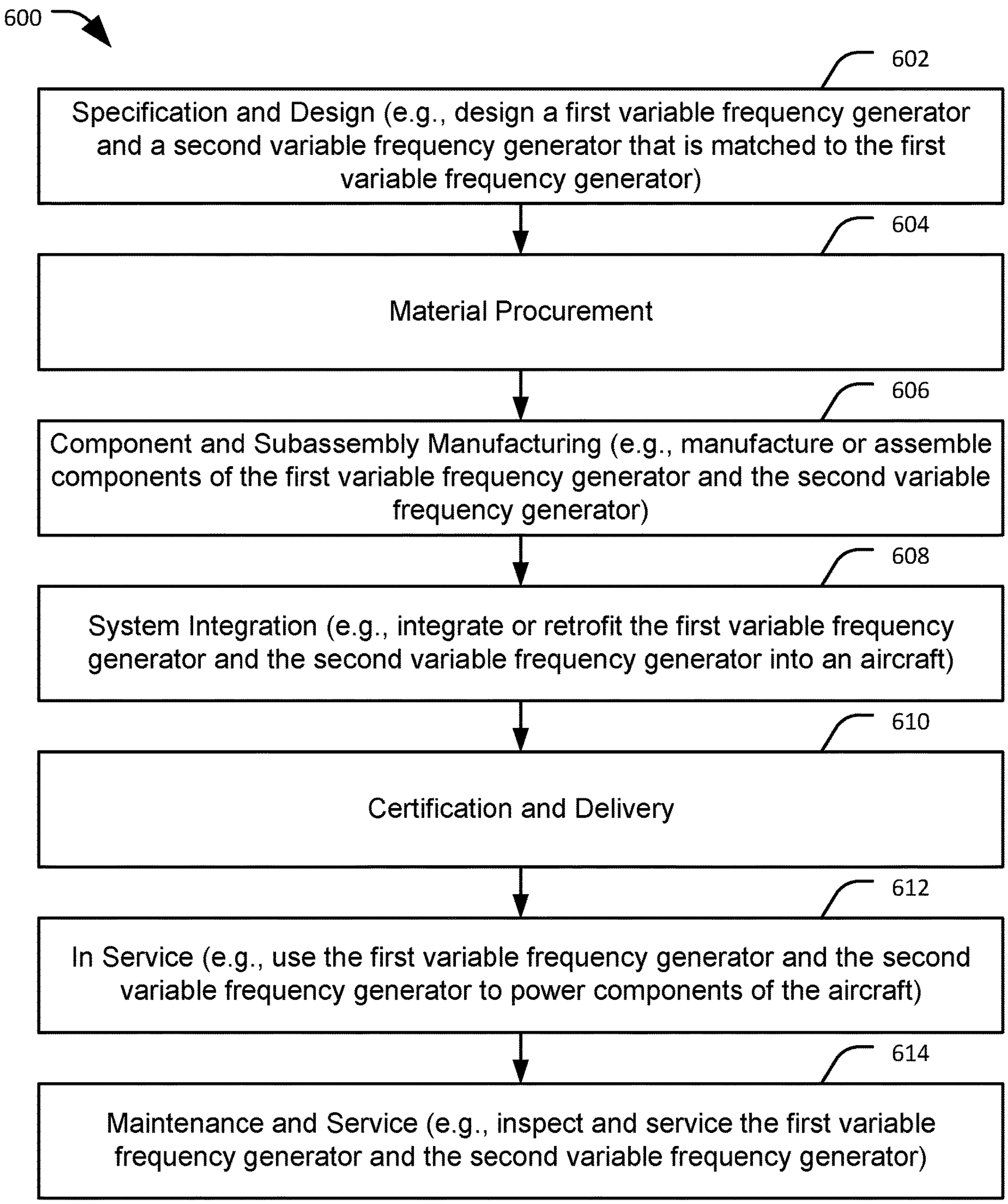
FIG. 6 is a flow chart of an example of a life cycle of a vehicle including the system of FIG. 1, the system of FIG. 2, the system of FIG. 3, or the system of FIG. 4.

Referring to FIG. 6, a flowchart of an illustrative example of a life cycle of a vehicle (e.g., an aircraft) is depicted and generally designated 600. During pre-production, the method 600 includes specification and design of the vehicle, at 602. During the specification and design of the vehicle, the method 600 includes specifying components, such as one or more components of any of the system 100 of FIG. 1, the system 200 of FIG. 2, the system 300 of FIG. 3, or the system 400 of FIG. 4. In a particular example, specification and design includes matching the first variable frequency generator 106 to the second variable frequency generator 116 such that the first multiphase signal 113 is phase aligned with the second multiphase signal 123 (or that the first multiphase signal 314 is phase aligned with the second multiphase signal 324). Alternatively or in addition, in some examples, specification and design includes matching the third variable frequency generator 206 to the fourth variable frequency generator 216 such that the third multiphase signal 213 is phase aligned with the fourth multiphase signal 223.

At 604, the method 600 includes material procurement. For example, the method 600 can include procuring materials for the vehicle, such as by procuring materials for one or more components of any of the system 100 of FIG. 1, the system 200 of FIG. 2, the system 300 of FIG. 3, or the system 400 of FIG. 4.

During production, the method 600 includes component and subassembly manufacturing, at 606, and system integration of the vehicle, at 608. In some examples, components of any of the system 100 of FIG. 1, the system 200 of FIG. 2, the system 300 of FIG. 3, or the system 400 of FIG. 4 are manufactured or assembled (at 606) and integrated within the vehicle (at 608).

The method 600 includes certification and delivery of the vehicle, at 610, and placing the vehicle in service, at 612. In some implementations, certifying the vehicle includes performing a test process of one or more components of the vehicle, such as by testing operation of any of the system 100 of FIG. 1, the system 200 of FIG. 2, the system 300 of FIG. 3, or the system 400 of FIG. 4. As a particular example, operation of the first variable frequency generator 106 and the second variable frequency generator 116 can be tested, such as by measuring voltage or current to verify that the first multiphase signal 113 is phase aligned with the second multiphase signal 123 (or that the first multiphase signal 314 is phase aligned with the second multiphase signal 324). Alternatively or in addition, operation of the third variable frequency generator 206 and the fourth variable frequency generator 216 can be tested, such as by measuring voltage or current to verify that the third multiphase signal 213 is phase aligned with the fourth multiphase signal 223 (or that the third multiphase signal 414 is phase aligned with the fourth multiphase signal 424).

While in service, the vehicle may be scheduled for routine maintenance and service (which may also include modification, reconfiguration, refurbishment, and so on). At 614, the method 600 includes performing maintenance and service of the vehicle. To illustrate, in some examples, performing maintenance and service may include inspecting and servicing components of any of the system 100 of FIG. 1, the system 200 of FIG. 2, the system 300 of FIG. 3, or the system 400 of FIG. 4.

In some implementations, operations of the method 600 are performed to "retrofit" one or more components within the vehicle. In this case, the method 600 can optionally include inspecting, disconnecting, and/or removing components of a conventional system from the vehicle prior to installing components of any of the system 100 of FIG. 1, the system 200 of FIG. 2, the system 300 of FIG. 3, or the system 400 of FIG. 4 within the vehicle (e.g., during maintenance and service, at 614). In other implementations, components of any of the system 100 of FIG. 1, the system 200 of FIG. 2, the system 300 of FIG. 3, or the system 400 of FIG. 4 can be integrated within the vehicle during manufacturing of the vehicle (e.g., during system integration, at 608).

Figure 7:
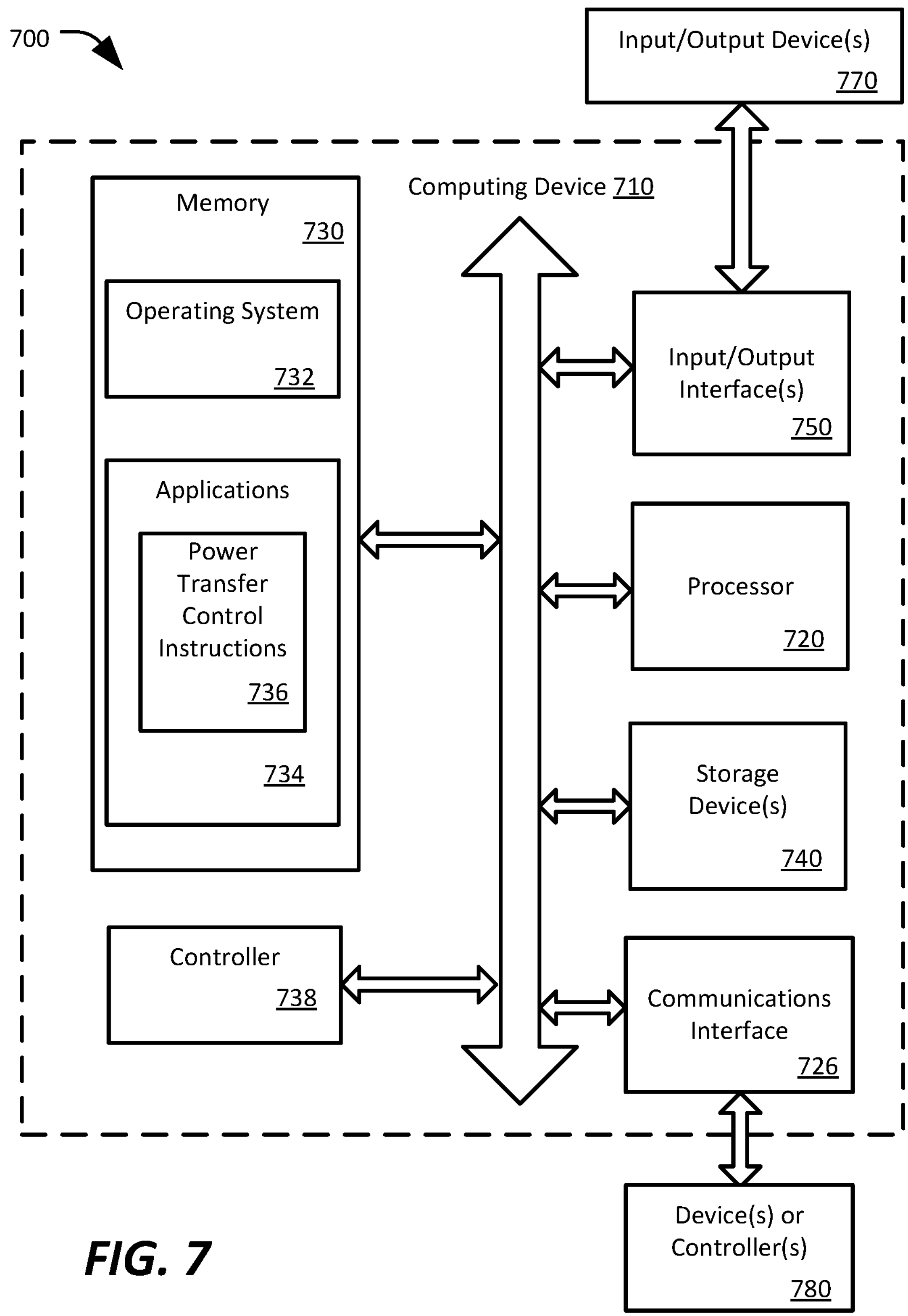
FIG. 7 is a block diagram illustrating aspects of an example of a computing system that is configured to execute instructions to initiate, perform, or control operations, such as operations of the method of FIG. 5.

FIG. 7 is an illustration of a block diagram of a computing environment 700 including a computing device 710. The computing device 710 is configured to support embodiments of computer-implemented methods and computer-executable program instructions (or code) according to the disclosure. In some examples, the computing device 710, or portions thereof, is configured to execute instructions to initiate, perform, or control operations described herein, such as operations of the method 500 of FIG. 5. In some implementations, the computing device 710 is integrated within a vehicle, such as an aircraft.

The computing device 710 includes a processor 720. The processor 720 is configured to communicate with a memory 730 (e.g., a system memory or another memory), one or more storage devices 740, one or more input/output interfaces 750, a communications interface 726, or a combination thereof.

Depending on the particular implementation, the memory 730 includes volatile memory devices (e.g., volatile random access memory (RAM) devices), nonvolatile memory devices (e.g., read-only memory (ROM) devices, programmable read-only memory, or flash memory), one or more other memory devices, or a combination thereof. In FIG. 7, the memory 730 stores an operating system 732, which can include a basic input/output system for booting the computing device 710 as well as a full operating system to enable the computing device 710 to interact with users, other programs, and other devices. The example of FIG. 7 also depicts that the memory 730 stores one or more applications 734 executable by the processor 720. In some examples, the one or more applications 734 include instructions executable by the processor 720 to transmit data or signals between components of the computing device 710, such as the memory 730, the one or more storage devices 740, the one or more input/output interfaces 750, the communications interface 726, or a combination thereof.

In the example of FIG. 7, the one or more applications 734 include power transfer control instructions 736. In a particular example, the computing device 710 includes a controller 738 configured to execute the power transfer control instructions 736 to control one or more operations described herein, such as one or more operations of the method 500 of FIG. 5. To illustrate, in some implementations, the controller 738 is coupled to the switches 124, 126, 130, 136, 138, 150, 224, 226, 230, 236, 238, 250, 262, 266, 272, 276, 282, and 284. In a particular example, the controller 738 is configured to execute the power transfer control instructions 736 to selectively actuate the switches 124, 126, 130, 136, 138, 150, 224, 226, 230, 236, 238, 250, 262, 266, 272, 276, 282, and 284.

To further illustrate, some examples, the controller 738 is configured to actuate one or more switches of the system 100, the system 200, the system 300, or the system 400. To illustrate, in some example, the controller 738 is configured to actuate one or more switches (e.g., by activating the switches 124, 136) to power the first electrical system 142 based on the first multiphase signal 113.

In some examples, the controller 738 is configured to initiate an NBPT of powering of the first electrical system 142 from the first variable frequency generator 106 (via the first multiphase signal 113) to the second variable frequency generator 116 (via the second multiphase signal 123). In one example, the controller 738 is configured to actuate one or more switches to power the first electrical system 142 based on the second multiphase signal 123 during an NBPT from the first variable frequency generator 106 to the second variable frequency generator 116, such as by activating the switches 126, 138 while the switches 124, 136 are activated. To further illustrate, in some implementations, the controller 738 is configured to actuate a first switch (e.g., the switch 126 or the switch 138) to power a first electrical system 142 based on the first multiphase signal 113 and to actuate a second switch (e.g., the switch 126 or the switch 138) to power the first electrical system 142 based on the second multiphase signal 123 during the NBPT.

In some examples, the controller 738 is configured to decouple the first variable frequency generator 106 from the first electrical system 142, using one or more switches of the system 100, the system 200, the system 300, or the system 400, after coupling the second variable frequency generator 116 to the first electrical system 142. For example, in some implementations, the controller 738 is configured deactivate the switches 124, 136 after activating the switches 126, 138. To further illustrate, in some examples, the controller 738 is configured to decouple the first variable frequency generator 106 from the first electrical system 142, via the first switch (e.g., the first switch 124 or the switch 136), after coupling, via the second switch (e.g., the switch 126 or the switch 138), the second variable frequency generator 116 to the first electrical system 142.

In some implementations, one or more storage devices 740 include nonvolatile storage devices, such as magnetic disks, optical disks, or flash memory devices. In some examples, the one or more storage devices 740 include removable memory devices, non-removable memory devices or both. In some cases, the one or more storage devices 740 are configured to store an operating system, images of operating systems, applications, and program data. In a particular example, the memory 730, the one or more storage devices 740, or both, include tangible computer-readable media.

In the example of FIG. 7, the processor 720 is configured to communicate with the one or more input/output interfaces 750 to enable the computing device 710 to communicate with one or more input/output devices 770 to facilitate user interaction. In some implementations, the one or more input/output interfaces 750 include one or more serial interfaces (e.g., universal serial bus (USB) interfaces or Institute of Electrical and Electronics Engineers (IEEE) 1394 interfaces), parallel interfaces, display adapters, audio adapters, one or more other interfaces, or a combination thereof. In some examples, the one or more input/output devices 770 include keyboards, pointing devices, displays, speakers, microphones, touch screens, one or more other devices, or a combination thereof. In some examples, the processor 720 is configured to detect interaction events based on user input received via the one or more input/output interfaces 750. Alternatively or in addition, in some implementations, the processor 720 is configured to send information to a display via the one or more input/output interfaces 750.

In a particular example, the processor 720 is configured to communicate with (e.g., send signals to) one or more devices 780 using the communications interface 726. In some implementations, the communications interface 726 includes one or more wired interfaces (e.g., Ethernet interfaces), one or more wireless interfaces that comply with an IEEE 802.11 communication protocol, one or more other wireless interfaces, one or more optical interfaces, or one or more other network interfaces, or a combination thereof. In some examples, the one or more devices 780 include host computers, servers, workstations, one or more other computing devices, or a combination thereof.

Figure 8:
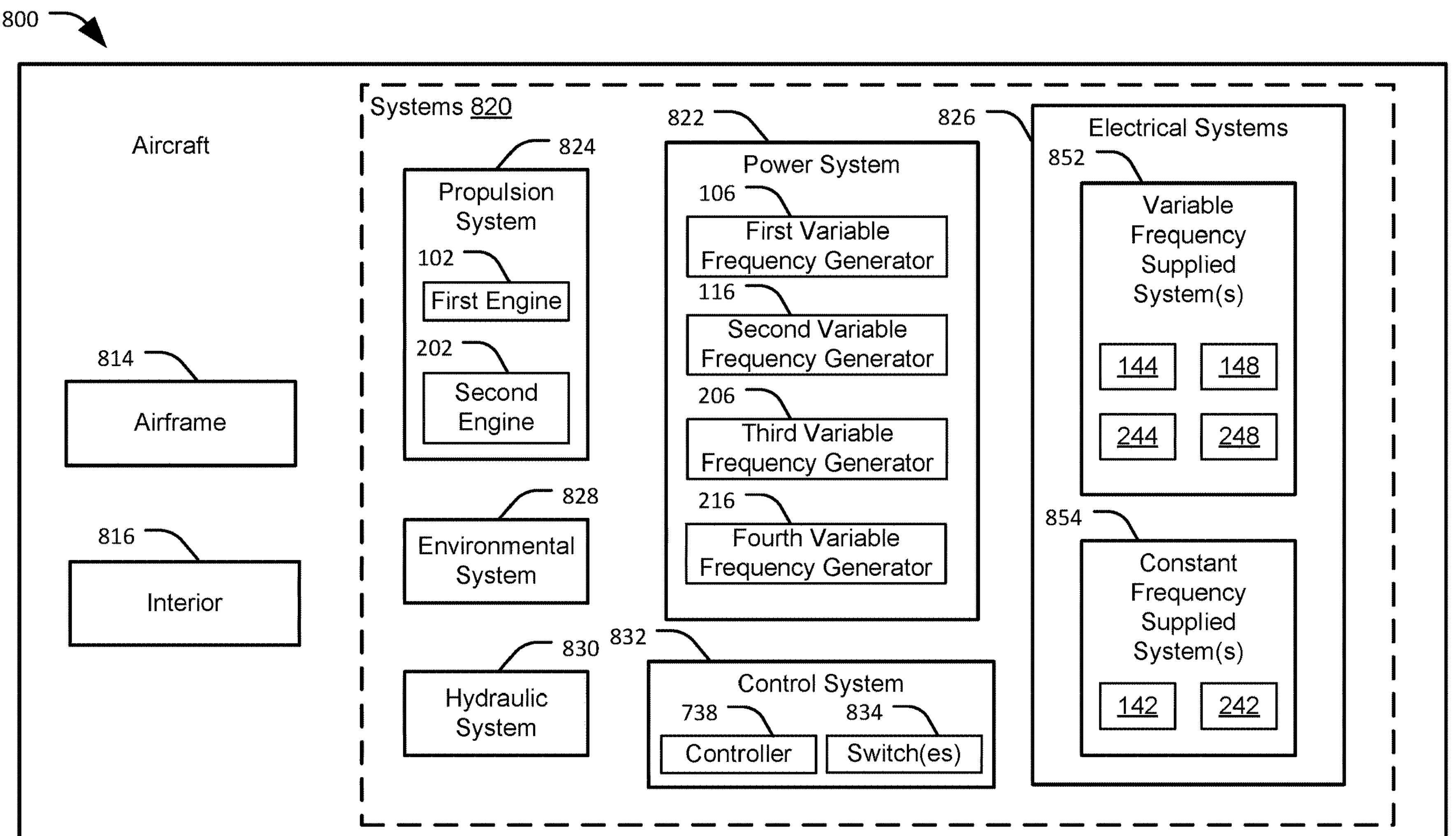
FIG. 8 is a block diagram illustrating aspects of an illustrative implementation of a vehicle that includes the system of FIG. 1, the system of FIG. 2, the system of FIG. 3, or the system of FIG. 4.

Aspects of the disclosure may be described in the context of an example of a vehicle, such as an aircraft 800 as shown in the example of FIG. 8. As shown in FIG. 8, the aircraft 800 includes an airframe 814 with an interior 816 and a plurality of systems 820. Examples of the plurality of systems 820 include one or more of a propulsion system 824, an environmental system 828, a hydraulic system 830, a power system 822, electrical systems 826, and a control system 832.

In the example of FIG. 8, the propulsion system 824 includes the first engine 102 and the second engine 202. FIG. 8 also depicts that the power system 822 includes the first variable frequency generator 106, the second variable frequency generator 116, the third variable frequency generator 206, and the fourth variable frequency generator 216.

FIG. 8 also illustrates that the electrical systems 826 include one or more variable frequency supplied systems 852 and one or more constant frequency supplied systems 854. In the example of FIG. 8, the one or more variable frequency supplied systems 852 include the electrical systems 144, 148, 244, and 248, and the one or more constant frequency supplied systems 854 include the electrical systems 142 and 242.

In FIG. 8, the control system 832 includes the controller 738. The controller 738 is coupled to and configured to selectively actuate one or more switches 834. In some examples, the one or more switches 834 include one or more of the switches 124, 126, 130, 136, 138, 150, 224, 226, 230, 236, 238, 250, 262, 266, 272, 276, 282, and 284.

The illustrations of the examples described herein are intended to provide a general understanding of the structure of the various implementations. The illustrations are not intended to serve as a complete description of all of the elements and features of apparatuses and systems that utilize the structures or methods described herein. Many other implementations may be apparent to those of skill in the art upon reviewing the disclosure. Other implementations may be utilized and derived from the disclosure, such that structural and logical substitutions and changes may be made without departing from the scope of the disclosure. For example, method operations may be performed in a different order than shown in the figures or one or more method operations may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single implementation for the purpose of streamlining the disclosure. Examples described above illustrate, but do not limit, the disclosure. It should also be understood that numerous modifications and variations are possible in accordance with the principles of the present disclosure. As the following claims reflect, the claimed subject matter may be directed to less than all of the features of any of the disclosed examples. Accordingly, the scope of the disclosure is defined by the following claims and their equivalents.

What is claimed is:

1. An aircraft comprising:

an engine;

a first variable frequency generator having a first rotor and a first stator, the first rotor coupled, via a first rotary coupling, to the engine and rotatable at a rate that is based on a rotational rate of the engine to cause the first variable frequency generator to generate a first multiphase signal;

a second variable frequency generator having a second rotor and a second stator, the second rotor coupled, via a second rotary coupling, to the engine and rotatable at the rate that is based on the rotational rate of the engine to cause the second variable frequency generator to generate a second multiphase signal, wherein the first rotary coupling and the first variable frequency generator are matched to the second rotary coupling and the second variable frequency generator to cause the second multiphase signal generated by the second variable frequency generator to be phase aligned with the first multiphase signal generated by the first variable frequency generator;

a first power bus coupled to the first variable frequency generator;

a second power bus coupled to the second variable frequency generator, the first and second power buses coupled to a first electrical system; and a plurality of switches configured to selectively provide power to the first electrical system based on either the first multiphase signal or the second multiphase signal, wherein a first switch of the plurality of switches is coupled between the first variable frequency generator and the first power bus, a second switch of the plurality of switches is coupled between the second variable frequency generator and the second power bus, and a third switch of plurality of switches is coupled between the first power bus and the second power bus.

2. The aircraft of claim 1, further comprising a controller configured to actuate the one or more of the plurality of switches to power the first electrical system based on the second multiphase signal during a non-break power transfer (NBPT) from the first variable frequency generator to the second variable frequency generator.

3. The aircraft of claim 1, wherein, in order to have the first rotary coupling and the first variable frequency generator matched to the second rotary coupling and the second variable frequency generator, a mounting position and a weight of the first rotor are matched to a mounting position and a weight of the second rotor so that, for a particular position of the engine, both the first rotor and the second rotor have a common position relative to the first stator and the second stator, respectively.

4. The aircraft of claim 1, wherein, the first and second power buses are configured to selectively couple, by the plurality of switches, to the first variable frequency generator or the second variable frequency generator to receive a selected multiphase signal, and further comprising:

a first auto-transformer unit (ATU) coupled to the one or more power buses and configured to convert the selected multiphase signal to a first multiphase output signal; and a second ATU coupled to the one or more power buses and configured to convert the selected multiphase signal to a second multiphase output signal.

5. The aircraft of claim 4, wherein the selected multiphase signal has a voltage of 230 volts root-mean-square (Vrms), and wherein the first multiphase output signal and the second multiphase output signal each have a voltage of 115 Vrms.

6. The aircraft of claim 1, further comprising an auto-transformer and rectifier unit (ATRU) configured to generate a constant-frequency output signal based on the first multiphase signal, the second multiphase signal, or both.

7. The aircraft of claim 6, wherein the ATRU is configured to convert the first multiphase signal, the second multiphase signal, or both, to a direct-current (DC) signal, and wherein the ATRU is configured to convert the DC signal to the constant-frequency output signal.

8. The aircraft of claim 7, wherein the first multiphase signal, the second multiphase signal, and the constant-frequency output signal each have a voltage of 115 volts root-mean-square (Vrms), and wherein the DC signal has a voltage of more than 115 volts DC.

9. The aircraft of claim 1, wherein, the first electrical system includes one or more components of the aircraft that use constant-frequency power; and the second electrical system includes one or more components of a aircraft that are compatible with variable frequency power.

10. The aircraft of claim 9, further comprising:

a third power bus;

a fourth power bus;

a first tie bus coupled to the first power bus and the fourth power bus and configured to enable a break power transfer from the second power bus to the third power bus; and a second tie bus coupled to the second power bus and the third power bus and configured to enable a break power transfer from the first power bus to the fourth power bus.

11. The aircraft of claim 1, wherein the engine is a first engine, the aircraft further comprising:

a second engine;

a third variable frequency generator having a third rotor and a third stator, the third rotor coupled, via a third rotary coupling, to the second engine and rotatable at a second rate that is based on a second rotational rate of the second engine to cause the third variable frequency generator to generate a third multiphase signal;

a fourth variable frequency generator having a fourth rotor and a fourth stator, the fourth rotor coupled, via a fourth rotary coupling, to the second engine and rotatable at the second rate that is based on the rotational rate of the second engine to cause the fourth variable frequency generator to generate a fourth multiphase signal, wherein the third rotary coupling and the third variable frequency generator are matched to the fourth rotary coupling and the fourth variable frequency generator such that the third multiphase signal is phase aligned with the fourth multiphase signal; and one or more second switches coupled to a second electrical system and configured to selectively provide either the third multiphase signal or the fourth multiphase signal to the second electrical system.

12. The aircraft of claim 11, further comprising:

a first transfer bus coupled to the first electrical system; and a second transfer bus coupled to the second electrical system.

13. The aircraft of claim 12, further comprising:

a first transfer switch coupled to the second transfer bus and configured to selectively provide, based on a particular state of the first transfer switch, a first constant frequency output signal to the second transfer bus; and a second transfer switch coupled to the first transfer bus and configured to selectively provide, based on a particular state of the second transfer switch, a second constant frequency output signal to the first transfer bus during a non-break power transfer (NBPT) from the first transfer bus to the second transfer bus.

14. An apparatus comprising:

a first variable frequency generator configured to generate, responsive to an engine coupled to the first variable frequency generator by a first rotary coupling, a first multiphase signal;

a second variable frequency generator configured to generate, responsive to the engine coupled to the second variable frequency generator by a second rotary coupling, a second multiphase signal, wherein the first rotary coupling and the first variable frequency generator are matched to the second rotary coupling and the second variable frequency generator to cause the second multiphase signal generated by the second variable frequency generator to be phase aligned with the first multiphase signal generated by the first variable frequency generator;

a first power bus coupled to the first variable frequency generator;

a second power bus coupled to the second variable frequency generator, the first and second power buses coupled to a first electrical system; and a controller configured to actuate a first switch to power the first electrical system based on the first multiphase signal, to actuate a second switch to power the first electrical system based on the second multiphase signal during a non-break power transfer (NBPT) from the first variable frequency generator to the second variable frequency generator, and to actuate a third switch to selectively couple the second power bus to the first power bus, and wherein the first switch is coupled between the first variable frequency generator and the first power bus, the second switch is coupled between the second variable frequency generator and the second power bus and the third is coupled between the first power bus and the second power bus.

15. The apparatus of claim 14, wherein the controller is further configured to decouple the first variable frequency generator from the first electrical system, via the first switch, after coupling, via the second switch, the second variable frequency generator to the first electrical system.

16. The apparatus of claim 14, wherein, the first and second power buses are configured to selectively couple, by a plurality of switches, to the first variable frequency generator or the second variable frequency generator to receive a selected multiphase signal, wherein the plurality of switches includes the first switch, the second switch, and the third switch, and further comprising:

a first auto-transformer unit (ATU) coupled to the one or more power buses and configured to convert the selected multiphase signal to a first multiphase output signal; and a second ATU coupled to the one or more power buses and configured to convert the selected multiphase signal to a second multiphase output signal.

17. The apparatus of claim 14, further comprising an auto-transformer and rectifier unit (ATRU) coupled to the first switch and the second switch, the ATRU configured to generate a constant-frequency output signal based on one or both of the first multiphase signal or the second multiphase signal.

18. A method comprising:

generating, by a first variable frequency generator and responsive to an engine coupled to the first variable frequency generator by a first rotary coupling, a first multiphase signal;

generating, by a second variable frequency generator and responsive to the engine coupled to the second variable frequency generator by a second rotary coupling, a second multiphase signal phase aligned with the first multiphase signal, wherein the first rotary coupling and the first variable frequency generator are matched to the second rotary coupling and the second variable frequency generator to cause the second multiphase signal generated by the second variable frequency generator to be phase aligned with the first multiphase signal generated by the first variable frequency generator;

powering an electrical system based on the first multiphase signal; and prior to decoupling the electrical system from first variable frequency generator using a first switch, actuating a second switch to power the electrical system based on the second multiphase signal during a non-break power transfer (NBPT) from the first variable frequency generator to the second variable frequency generator, and selectively couple a first power bus to a second power bus using a third switch, wherein the first and second power buses are coupled to the electrical system, the first switch is coupled between the first variable frequency generator and the first power bus, the second switch is coupled between the second variable frequency generator and the second power bus, and the third switch is coupled between the first power bus and the second power bus.

19. The method of claim 18, wherein, during the NBPT, the first variable frequency generator powers the electrical system based on the first multiphase signal via the first switch and the second variable frequency generator powers the electrical system based on the second multiphase signal via the second switch.

20. The method of claim 18, further comprising, after performing the NBPT, decoupling the electrical system from the first variable frequency generator using the first switch.

* * * * *